US006870241B2

(12) United States Patent
Nakatani et al.

(10) Patent No.: US 6,870,241 B2
(45) Date of Patent: Mar. 22, 2005

(54) HIGH FREQUENCY SWITCH CIRCUIT DEVICE

(75) Inventors: Toshifumi Nakatani, Moriguchi (JP); Junji Ito, Hirakata (JP); Ikuo Imanishi, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 324 days.

(21) Appl. No.: 09/993,712

(22) Filed: Nov. 27, 2001

(65) Prior Publication Data

US 2002/0063270 A1 May 30, 2002

(30) Foreign Application Priority Data

Nov. 27, 2000 (JP) ........................................ 2000-358775

(51) Int. Cl.[7] .............................................. H01L 29/00
(52) U.S. Cl. ...................... 257/531; 257/347; 257/379; 257/516; 257/528; 257/536; 327/308; 327/408; 333/101; 333/103
(58) Field of Search ................................ 257/347, 379, 257/516, 528, 531, 536; 327/308, 403; 333/101, 103

(56) References Cited

U.S. PATENT DOCUMENTS

| | | | | |
|---|---|---|---|---|
| 4,433,920 A | * | 2/1984 | Sekiya et al. ............... | 368/201 |
| 5,952,893 A | * | 9/1999 | Ghoshal .................. | 331/108 C |
| 6,137,142 A | * | 10/2000 | Burr ........................... | 257/349 |
| 6,153,914 A | * | 11/2000 | Mulatti et al. .............. | 257/372 |
| 6,236,070 B1 | * | 5/2001 | Griffin et al. ............... | 257/192 |
| 6,452,249 B1 | * | 9/2002 | Maeda et al. ............... | 257/531 |
| 6,492,872 B1 | * | 12/2002 | Fujioka et al. .............. | 330/285 |

FOREIGN PATENT DOCUMENTS

| JP | 03089548 A | * | 4/1991 | .......... H01L/27/04 |
|---|---|---|---|---|
| JP | 10-242826 A | | 9/1998 | |

* cited by examiner

*Primary Examiner*—Tom Thomas
*Assistant Examiner*—Matthew E. Warren
(74) *Attorney, Agent, or Firm*—McDermott Will & Emery LLP

(57) ABSTRACT

A high frequency switch circuit device includes an FET to be a switching element on a semiconductor substrate. The FET includes an n-type well, a gate electrode, a source layer and a drain layer. An n-type well line to be connected to an n-type well layer to be a back gate is connected to a voltage supply node via an inductor. The flow of a high frequency signal between the voltage supply node and the n-type well layer is blocked by the inductor, and the flow of a high frequency signal in the vertical direction is blocked by a depletion layer extending between the n-type well and a p-type substrate region. Moreover, the flow of a high frequency signal in the horizontal direction is blocked by a trench separation insulative layer.

27 Claims, 9 Drawing Sheets

HIGH FREQUENCY SWITCH CIRCUIT DEVICE

BACKGROUND OF THE INVENTION

The present invention relates to a high frequency switch circuit device formed on a semiconductor substance for gating, i.e., selectively transmitting or blocking, a high frequency signal passing therethrough.

In recent years, there have been drastic developments in the art of mobile communication devices such as portable telephones or personal digital assistants (PDAS). In order to meet the demands for increasing the functionality of such devices and for reducing the size and weight thereof, attempts have been made in the art to reduce the size and the power consumption of, and to increase the degree of integration of, semiconductor integrated circuits at a high pace.

In a mobile communication device, a high frequency switch circuit for gating a high frequency signal is an important circuit that is used for switching between a transmission mode and a reception mode of an antenna circuit. As a switching element for gating a high frequency signal, those using a GaAs-FET provided on a gallium arsenic (GaAs) substrate are widely known in the prior art. Along with the recent developments in the minute processing techniques, an Si-FET provided on a silicon substrate has also been used as a high frequency signal switching element. As compared to a GaAs-FET, an Si-FET can be manufactured at a lower cost since a silicon substrate itself is inexpensive and the mass production techniques therefor have been well established. Where a gallium arsenic substrate is used, it is typical that devices which are not required to have high frequency characteristics, or those which are required to have high frequency characteristics but not high-level frequency characteristics, are separately provided on a silicon substrate in order to reduce the chip area of the gallium arsenic substrate as much as possible since a gallium arsenic substrate is expensive. In contrast, where a silicon substrate is used, there is an advantage that it is possible to provide an integrated circuit device by integrating elements (active elements and passive elements) that are required for a mobile communication device together with a high frequency signal switching element into a single substrate as much as possible.

In such a case, unlike a GaAs-FET using a semi-insulative substrate, an Si-FET using a silicon substrate, which functions as a conductor, is a 4-terminal element that requires a back gate (corresponding to a well region under a channel in the substrate) for fixing a substrate potential, as well as a source, a drain and a gate. Therefore, in an Si-FET, a high frequency signal is likely to leak from the drain or the source to the back gate via a capacitance between the drain and the back gate and a capacitance between the source and the back gate. Thus, the transmission loss of an Si-FET may increase, thereby deteriorating its performance as a switching element. In order to avoid such a problem, attempts have been made in the prior art to reduce the leak of a high frequency signal from the back gate of an Si-FET.

FIG. 8 is an electric circuit diagram of a high frequency switch circuit described in Japanese Laid-Open Patent Publication No. 10-242826, illustrating an example of a conventional high frequency switch circuit. As illustrated in the figure, a conventional high frequency switch circuit is provided between a first node P1 and a second node P2. The high frequency switch circuit includes: a first transistor (FET) 201 and a second transistor (FET) 202 serially connected to each other; a third transistor (FET) 203 provided between the first node P1 and the ground; a fourth transistor (FET) 204 provided between the second node P2 and the ground; resistors 205 to 208 provided so as to be connected to the gates of the transistors 201 to 204, respectively; a resistor 209 provided between the back gate (the node denoted by "BG" in FIG. 8) of each of the first and second transistors 201 and 202 and the ground; a resistor 210 provided between the back gate of the transistor 203 and the ground; and a resistor 211 provided between the back gate of the transistor 204 and the ground. Control voltages Vc and /Vc are used to switch the connection between a third node P3 (connected to the node between the first and second transistors 201 and 202) and the first node P1 and the connection between the third node P3 and the second node P2 from one to another. Specifically, the signal transmission path is switched between the path between the first node P1 and the third node P3 and the path between the second node P2 and the third node P3 by using the control voltage Vc to turn ON/OFF the first and fourth transistors 201 and 204 and the control voltage /Vc to control the gate voltage of the second and third transistors 202 and 203 so as to turn ON/OFF the respective transistors.

In the conventional high frequency switch circuit, the resistors 205 to 208 are provided between the ground and the back gates of the transistors 201 to 204, respectively, whereby it is possible to reduce the transmission loss of a high frequency signal due to a drain-back gate capacitance or a source-back gate capacitance.

The conventional high frequency switch circuit described above is, in principle, capable of reducing the transmission loss of a high frequency signal due to a drain-back gate capacitance or a source-back gate capacitance. However, in an integrated circuit device including the high frequency switch circuit, the transmission loss of a high frequency signal in the high frequency switch circuit may increase, thereby deteriorating its performance as a high frequency switch, for the following reason.

Where a plurality of circuits are integrated together into a single silicon substrate, the silicon substrate needs to be grounded in order to prevent the parasitic oscillation of each transistor and to separate the circuits from one another. As a result, in the high frequency signal switching element described in the above publication as illustrated in FIG. 8, the back gate connected to the ground via a resistor is connected to the ground also via a path through the silicon substrate. Therefore, a high frequency signal leaks from the back gate to the ground via the silicon substrate, thereby increasing the transmission loss.

SUMMARY OF THE INVENTION

An object of the present invention is to provide a high frequency switch circuit device including a high frequency switching element, in which the transmission loss of a high frequency signal is reduced even when it is integrated together with other semiconductor circuits into a single semiconductor substrate.

A first high frequency switch circuit device of the present invention includes: a semiconductor substrate including a p-type substrate region; a p-channel type FET provided in the p-type substrate region and functioning as a high frequency switching element including a source, a drain, a gate and an n-type well; a voltage supply node connected to the n-type well for transmitting a voltage signal to be supplied to the n-type well; and high frequency signal separation means provided between the n-type well and the voltage supply node for separating a high frequency component of a signal flowing between the n-type well and the voltage supply node.

In this way, the high frequency component of the voltage signal passing between the n-type well and the voltage supply node of the p-channel FET is blocked in the circuit. The flow of a high frequency signal between the p-type substrate region and the n-type well is blocked in the semiconductor substrate as the depletion layer expands between the n-type well and the p-type substrate region even if a voltage is applied to the n-type well, which corresponds to the back gate. Therefore, even when the high frequency switch circuit is integrated together with other semiconductor circuits into a single semiconductor substrate, the signal leak via the n-type well can be reduced, thereby reducing the transmission loss of a high frequency signal.

The high frequency switch circuit device may further include an insulative separation layer surrounding the n-type well and extending downward from a surface of the semiconductor substrate to a position deeper than the n-type well. In this way, it is possible to more reliably reduce the transmission loss of a high frequency signal in the horizontal direction of the semiconductor substrate.

The semiconductor substrate may be an SOI substrate obtained by providing the n-type well on an insulator layer. In this way, it is possible to more reliably reduce the transmission loss of a high frequency signal in the vertical direction of the semiconductor substrate.

The high frequency switch circuit device may further include another high frequency signal separation means provided between the n-type well and a ground so as to separate a high frequency component of a signal flowing between the n-type well and the ground. In this way, it is possible to further stabilize the voltage of the n-type well to be the back gate and suppress the transmission loss of a high frequency signal.

A second high frequency switch circuit device of the present invention includes: a semiconductor substrate including a p-type substrate region; an n-channel type FET provided in the p-type substrate region and functioning as a high frequency switching element including a source, a drain, a gate and a p-type well; a barrier layer provided between the p-type substrate region and the p-type well and serving as a barrier against a flow of a high frequency signal between the p-type substrate region and the p-type well; and high frequency signal separation means provided between the p-type well and a ground for separating a high frequency component of a signal flowing between the p-type well and the ground.

In this way, the high frequency component of the voltage signal passing between the p-type well of the n-channel FET and the ground is blocked in the circuit. The flow of a high frequency signal between the p-type substrate region and the p-type well is blocked in the semiconductor substrate by the barrier layer even if a voltage is applied to the p-type well, which corresponds to the back gate. Therefore, even when the high frequency switch circuit is integrated together with other semiconductor circuits into a single semiconductor substrate, the signal leak via the p-type well can be reduced, thereby reducing the transmission loss of a high frequency signal.

The barrier layer may be an n-type well provided between the p-type substrate region and the p-type well, and the high frequency switch circuit device may further include: a voltage supply node connected to the n-type well for supplying a voltage to the n-type well; and another high frequency signal separation means provided between the n-type well and the voltage supply node so as to separate a high frequency component of a signal flowing between the n-type well and the voltage supply node. In this way, it is possible to reduce the transmission loss of a high frequency signal by utilizing the two depletion layers extending between the p-type well and the n-type well and between the n-type well and the p-type substrate region, respectively.

The high frequency switch circuit device may further include an insulative separation layer surrounding the p-type well and extending downward from a surface of the semiconductor substrate to a position deeper than the p-type well. In this way, it is possible to more reliably reduce the transmission loss of a high frequency signal in the horizontal direction of the semiconductor substrate.

The semiconductor substrate may be an SOI substrate obtained by providing the p-type well on an insulator layer. In this way, it is possible to more reliably reduce the transmission loss of a high frequency signal in the vertical direction of the semiconductor substrate.

The high frequency switch circuit device may further include another high frequency signal separation means provided between the p-type well and a ground so as to separate a high frequency component of a signal flowing between the p-type well and the ground. In this way, it is possible to further stabilize the voltage of the p-type well to be the back gate and suppress the transmission loss of a high frequency signal.

The high frequency signal separation means may be an inductor. More specifically, the inductor may be a coil-shaped line formed on the semiconductor substrate. In this way, an inductor can be easily integrated together with an FET on a semiconductor substrate, whereby it is possible to provide a downsized integrated circuit device at a low cost.

The high frequency signal separation means may be a resistor. More specifically, the resistor may be a polysilicon film formed on the semiconductor substrate. In this way, a resistor can be easily integrated together with an FET on a semiconductor substrate, whereby it is possible to provide a downsized integrated circuit device at a low cost.

The high frequency signal separation means may be a distribution constant line having a line length that is an odd number multiple of ¼ of a wavelength of a signal passing therethrough. More specifically, the distribution constant line may be a line formed on the semiconductor substrate. In this way, a line can be easily integrated together with an FET on a semiconductor substrate, whereby it is possible to provide a downsized integrated circuit device at a low cost.

The SOI substrate may be a silicon substrate having a buried insulative layer made of silicon oxide. In this way, it is possible to suppress an increase in the cost of a high frequency switch circuit device by utilizing an SOI substrate, which can be manufactured at a low cost.

The SOI substrate may be obtained by epitaxially growing a silicon crystal layer on a sapphire substrate.

DESCRIPTION OF THE PREFERRED EMBODIMENTS

Various embodiments of the present invention will now be described with reference to the drawings.

First Embodiment

Figure 1:
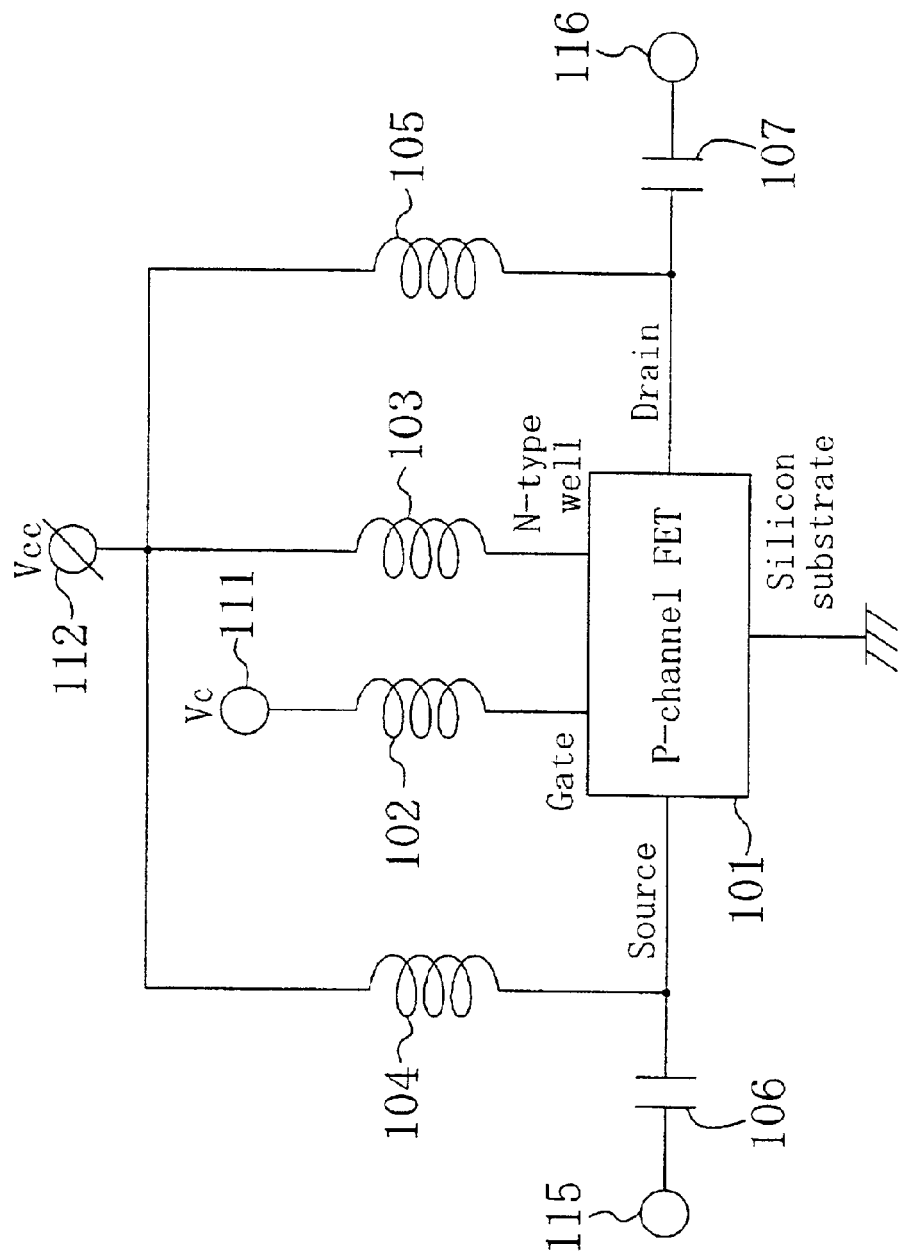
FIG. 1 is an electric circuit diagram illustrating a circuit configuration of a high frequency switch circuit device according to a first embodiment of the present invention.
Figure 2A:
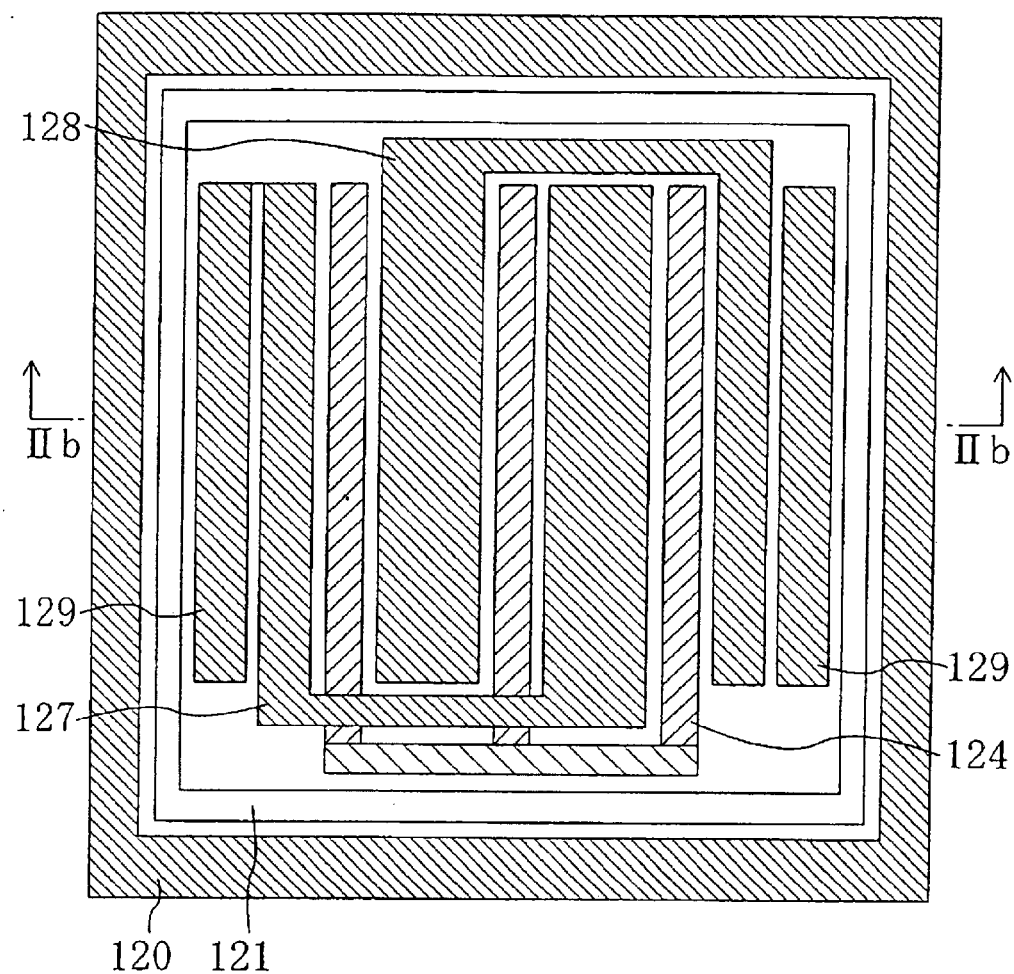
FIG. 2A is a plan view illustrating a p-channel FET of the first embodiment.
Figure 2B:
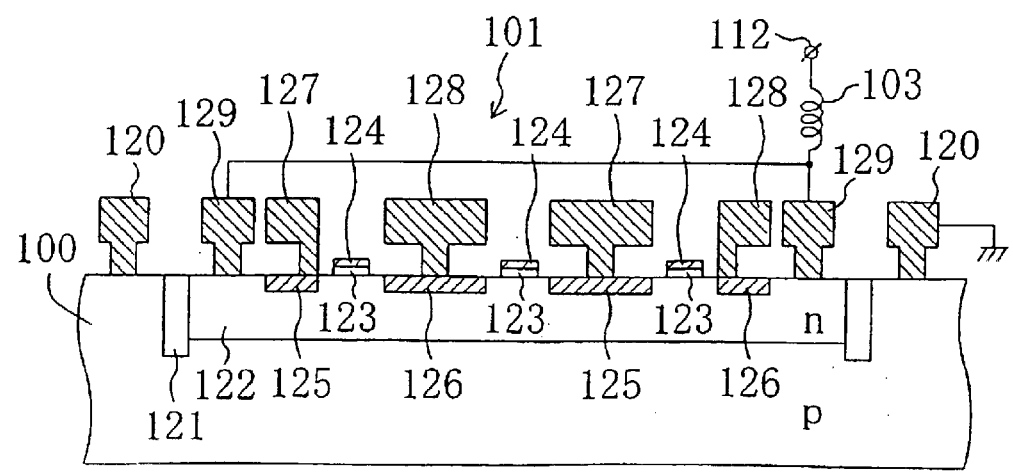
FIG. 2B is a cross-sectional view taken along line IIb—IIb.

FIG. 1 is an electric circuit diagram illustrating a circuit configuration of a high frequency switch circuit device according to a first embodiment of the present invention. As illustrated in the figure, the high frequency switch circuit device of the present embodiment includes a p-channel FET 101 (this and other FETs used in the present invention are JFETs) that is a switching element having a cross-sectional structure as illustrated in FIG. 2B to be described later. The p-channel FET 101 includes a source, a drain, a gate, and an n-type well corresponding to a back gate, which are provided on a silicon substrate. The gate of the p-channel FET 101 is connected, via an inductor 102, to a control voltage supply node 111 for supplying the control voltage Vc, and the n-type well corresponding to the back gate is connected, via an inductor 103, to a fixing voltage supply node 112 for supplying a fixing voltage Vcc. The source of the p-channel FET 101 is connected to the fixing voltage supply node 112 via an inductor 104 and to a first node 115 via a capacitor 106. The drain of the p-channel FET 101 is connected to the fixing voltage supply node 112 via an inductor 105 and to a second node 116 via a capacitor 107. The silicon substrate is connected to the ground.

The inductors 102 to 105 are designed so that the impedance of the frequency of a signal passing therethrough is sufficiently larger than those of the first node 115 and the second node 116. The capacitors 106 and 107 are provided for blocking a DC component from passing from the first and second nodes 115 and 116, respectively, to the p-channel FET 101.

With such a configuration, the n-type well corresponding to the back gate of the p-channel FET 101 and the p-type substrate region connected to the ground of the p-type silicon substrate are separated by the inductor 103 from each other with respect to high frequencies. In other words, the configuration is such that a high frequency component of a signal is separated.

Figure 8:
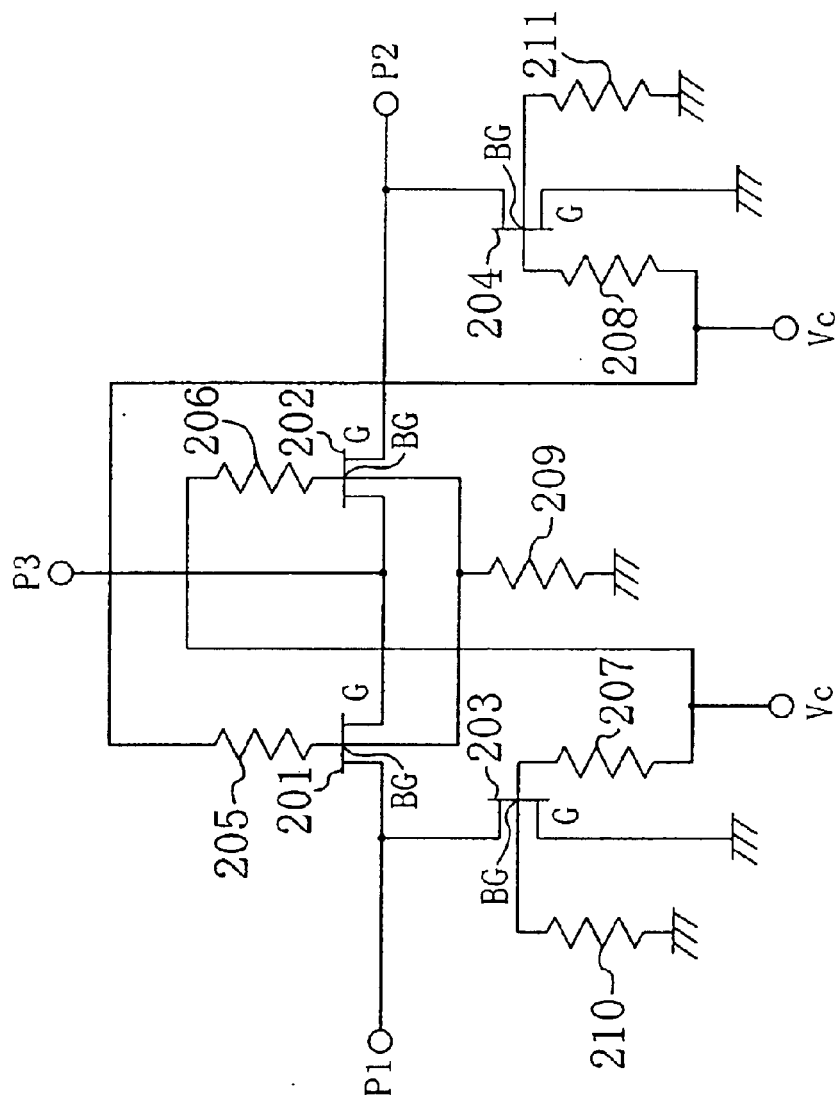
FIG. 8 is an electric circuit diagram illustrating a conventional high frequency switch circuit described in a Japanese laid-open patent publication.

The p-channel FET 101 illustrated in FIG. 1 corresponds to the first to fourth transistors 201 to 204 in the high frequency switch circuit illustrated in FIG. 8, and the first and second nodes 115 and 116 each correspond to a node between transistors. It can be assumed that capacitors are provided as necessary also in the conventional circuit illustrated in FIG. 8.

The operation of the high frequency switch circuit device having the configuration described above will now be described. When the control voltage Vc supplied from the control voltage supply node 111 is set to a low level, the p-channel FET 101 is closed (turned ON), whereby an electric signal flows between the first node 115 and the second node 116. When the control voltage Vc is set to a high level, the p-channel FET 101 is opened (turned OFF), thereby blocking the flow of an electric signal between the first node 115 and the second node 116. Therefore, it is possible to obtain a high frequency switch circuit that is suitable for an antenna circuit of a mobile communication device by, for example, configuring a high frequency switch circuit as illustrated in FIG. 8 while incorporating a high frequency switch circuit device that includes the p-channel FET 101 therein as in the present embodiment. Alternatively, the high frequency switch circuit device of the present embodiment can be used in various other types of devices for selectively blocking or transmitting the flow of a high frequency signal.

Next, an example of a configuration of the p-channel FET 101 illustrated in FIG. 1 will be described with reference to FIG. 2A and FIG. 2B. FIG. 2A is a plan view illustrating a p-channel FET of the present embodiment, and FIG. 2B is a cross-sectional view taken along line IIb—IIb of FIG. 2A.

As illustrated in FIG. 2A and FIG. 2B, an n-type well layer 122 and a trench isolation insulative layer 121 are formed in an upper portion of a p-type silicon substrate 100. The trench isolation insulative layer 121 surrounds the n-type well layer 122 so as to isolate and insulate the n-type well layer 122 from a p-type substrate region of the p-type silicon substrate 100 (a portion of the p-type silicon substrate 100 excluding the n-type well layer 122). Various elements of the p-channel FET 101 are provided as follows. A gate oxide film 123 made of a silicon oxide is provided on the n-type well layer 122, and a gate electrode 124 made of a polysilicon is provided on the gate oxide film 123. A source layer 125 and a drain layer 126 containing a p-type impurity are formed in the n-type well layer 122 beside the gate electrode 124. Moreover, there are formed a source line 127 connected to the source layer 125, a drain line 128 connected to the drain layer 126, an n-type well line 129 connected to the n-type well layer 122, and a p-type silicon substrate line 120 connected to the p-type silicon substrate 100. While FIG. 2 illustrates a configuration where two n-type well lines 129 are provided, the number of n-type well lines 129 may alternatively be one.

As illustrated in FIG. 2B, the n-type well line 129 is connected to the fixing voltage supply node 112 via the inductor 103.

Although not shown in FIG. 2B, the gate electrode 124 is connected to the control voltage supply node 111 via the inductor 102 illustrated in FIG. 1, the source line 127 is connected to the fixing voltage supply node 112 via the inductor 104 illustrated in FIG. 1 and to the first node 115 via the capacitor 106 illustrated in FIG. 1, and the drain line 128 is connected to the fixing voltage supply node 112 via the inductor 105 illustrated in FIG. 1 and to the second node 116 via the capacitor 107 illustrated in FIG. 1.

Although not shown in FIG. 2B, the inductors and the capacitors as described above may be formed on the p-type silicon substrate 100, or the inductors and the capacitors may alternatively be provided as discrete chip inductors and discrete chip condensers, respectively.

In the high frequency switch circuit device illustrated in FIG. 2A and FIG. 2B, when a positive control voltage Vc is applied to the fixing voltage supply node 112, a reverse bias is applied between the p-type substrate region and the n-type well layer 122 (back gate) of the p-type silicon substrate 100, thereby expanding the depletion layer at the p-n junction therebetween, so that the p-type substrate region and the n-type well layer 122 (back gate) of the p-type silicon substrate 100 are insulated and separated from each other in the vertical direction.

Next, the functions and effects provided by the high frequency switch circuit device of the present embodiment will be described with reference to FIG. 1, FIG. 2A and FIG. 2B.

The high frequency switch circuit device of the first embodiment of the present invention includes the inductor 103 between the n-type well (n-type well layer 122) corresponding to the back gate of the p-channel FET 101 and the fixing voltage supply node 112, as illustrated in FIG. 1, whereby a high frequency component of a signal (fixing voltage Vcc) passing between the n-type well of the p-channel FET 101 and the fixing voltage supply node 112 is blocked in the circuit. Moreover, since a p-channel FET is employed as an FET, and a p-n junction (depletion layer), at which a reverse bias is applied by the fixing voltage, is formed between the p-type substrate region and the n-type well layer 122 corresponding to the back gate of the p-type silicon substrate 100, the flow of a high frequency signal between the p-type substrate region and the n-type well is blocked in the p-type silicon substrate 100. Therefore, even when the high frequency switch circuit is integrated together with other semiconductor circuits into the p-type silicon substrate 100, the signal leak via the back gate can be reduced, thereby reducing the transmission loss of a high frequency signal.

Moreover, the n-type well layer 122 and the p-type substrate region of the p-type silicon substrate 100 are separated by the trench isolation insulative layer 121 with respect to high frequencies in the horizontal direction. In other words, the flow of a high frequency signal in the horizontal direction through the p-type silicon substrate 100 is blocked. Therefore, it is possible to more reliably reduce the transmission loss of a high frequency signal, which is particularly significant near the surface.

Variation of First Embodiment

Figure 3A:
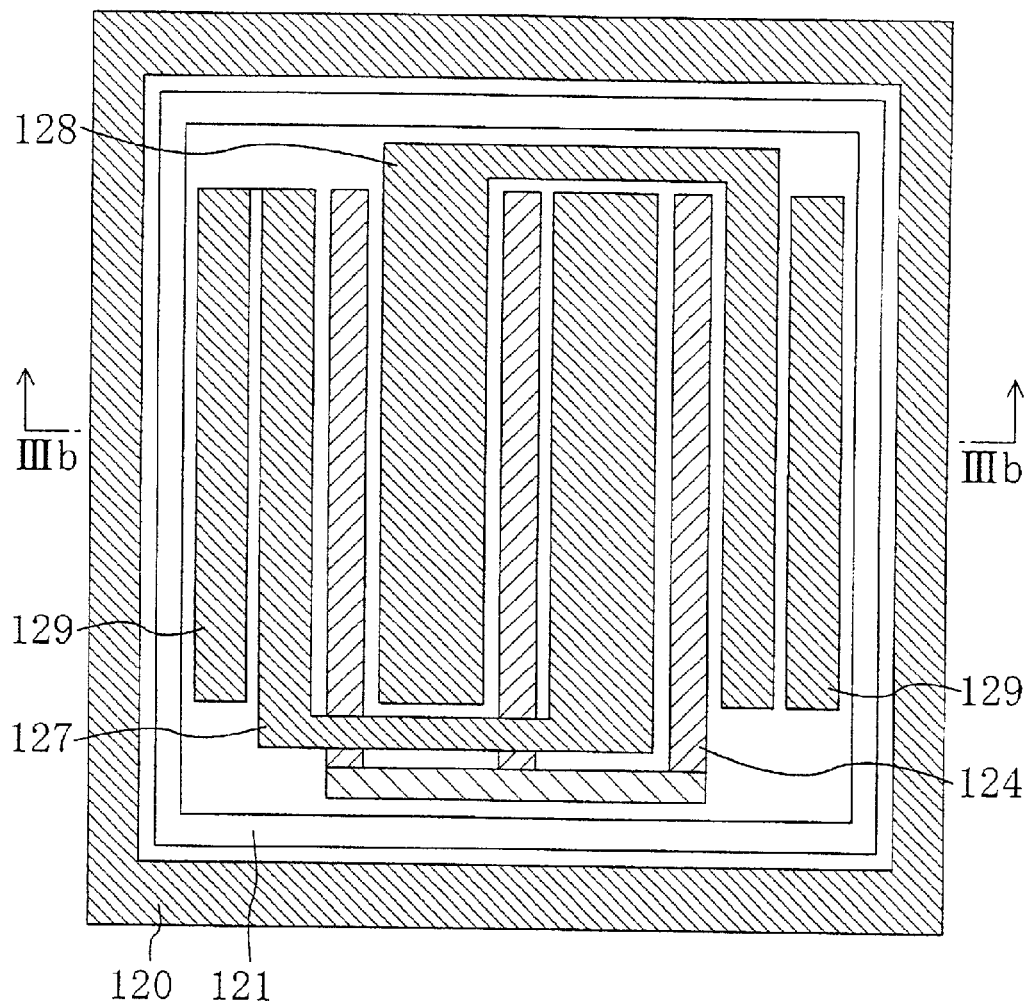
FIG. 3A is a plan view illustrating a high frequency switch circuit device according to a variation of the first embodiment.

Next, a variation of the first embodiment of the present invention will be described. The circuit configuration of the high frequency switch circuit device of this variation is as illustrated in the electric circuit diagram of FIG. 1 and thus is not shown in a separate figure. FIG. 3A is a plan view illustrating a high frequency switch circuit device according to this variation, and FIG. 3B is a cross-sectional view taken along line IIIb—IIIb of FIG. 3A.

Figure 3B:
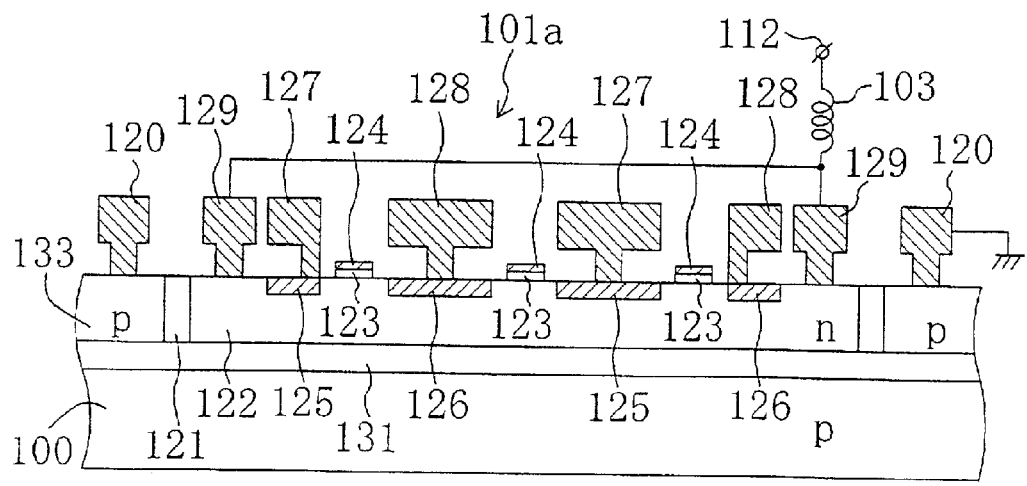
FIG. 3B is a cross-sectional view taken along line IIIb—IIIb.

As illustrated in FIG. 3A and FIG. 3B, in this variation, a buried insulative film 131, which is made of a silicon oxide, is formed at a predetermined depth from the surface of the p-type silicon substrate 100. The n-type well layer 122, a p-type silicon layer 133, and the trench isolation insulative layer 121 surrounding the n-type well layer 122 so as to separate and insulate the n-type well layer 122 and the p-type silicon layer 133 from each other in the horizontal direction, are formed above the buried insulative film 131. In this variation, a region of the p-type silicon substrate 100 below the buried insulative film 131 and the p-type silicon layer 133 are p-type substrate regions.

This variation is similar to the first embodiment illustrated in FIG. 2A and FIG. 2B in that a p-channel FET 101a includes the gate oxide film 123, the gate electrode 124, the source layer 125, the drain layer 126, the source line 127, the drain line 128 and the n-type well line 129. In this variation, the p-type silicon layer 133 provided above the buried insulative film 131 is connected to the ground via the silicon substrate line 120.

As illustrated in FIG. 3, this variation is similar to the first embodiment illustrated in FIG. 2A and FIG. 2B in that the n-type well line 129 is connected to the fixing voltage supply node 112 via the inductor 103.

Although not shown in FIG. 3A and FIG. 3B, this variation is similar to the first embodiment illustrated in FIG. 2A and FIG. 2B in that the gate electrode 124 is connected to the control voltage supply node 111 via the inductor 102 illustrated in FIG. 1, the source line 127 is connected to the fixing voltage supply node 112 via the inductor 104 illustrated in FIG. 1 and to the first node 115 via the inductor 104 illustrated in FIG. 1, and the drain line 128 is connected to the fixing voltage supply node 112 via the inductor 105 illustrated in FIG. 1 and to the second node 116 via the inductor 105 illustrated in FIG. 1.

Although not shown in FIG. 3A and FIG. 3B, the inductors and the capacitors as described above may be formed on the p-type silicon substrate 100, or the inductors and the capacitors may alternatively be provided as discrete chip inductors and discrete chip condensers, respectively.

As described above, also in the high frequency switch circuit device of this variation, the inductor 103 is provided between the n-type well layer 122 corresponding to the back gate of the p-channel FET 101a and the fixing voltage supply node 112, whereby a high frequency component of a signal (fixing voltage Vcc) passing between the n-type well layer 122 (back gate) of the p-channel FET 101a and the fixing voltage supply node 112 is blocked. Moreover, the flow of a high frequency signal between the p-type silicon layer 133 (p-type substrate region) and the n-type well layer 122 corresponding to the back gate is blocked by the buried insulative film 131. Therefore, it is possible to more reliably provide the effects of the first embodiment as described above.

In the first embodiment and the variation thereof, it is preferred that the inductors 102 to 105 are provided, in addition to the p-channel FET 101, in the single p-type silicon substrate 100. Each of the inductors 102 to 105 may be a coil-shaped conductive line, for example. It is possible to reduce the size and the cost of a high frequency switch circuit device by integrating the inductors 102 to 105 into a silicon semiconductor.

An example where an inductor is provided as means for blocking the flow of a high frequency signal between an n-type well corresponding to a back gate and a fixing voltage supply node (high frequency signal separation means) has been described above. Alternatively, effects as those of the first embodiment or the variation thereof can be obtained by using another type of element such as a resistor made of a polysilicon, or a line having a line length that is an odd number multiple of ¼ of the wavelength of a signal passing therethrough, as means for separating a high frequency component of a signal that is handled by the FET.

Moreover, in the variation of the first embodiment, a substrate in which the p-type silicon substrate 100 and the n-type well layer 122 corresponding to the back gate are separated from each other by the buried insulative film 131 is used as an SOI substrate. Alternatively, an SOI substrate obtained by providing a semiconductor layer on an insulative substrate may of course be used. For example, such an SOI substrate may be obtained by epitaxially growing a single-crystal silicon layer on a sapphire substrate or a spinel substrate.

Second Embodiment

Figure 4:
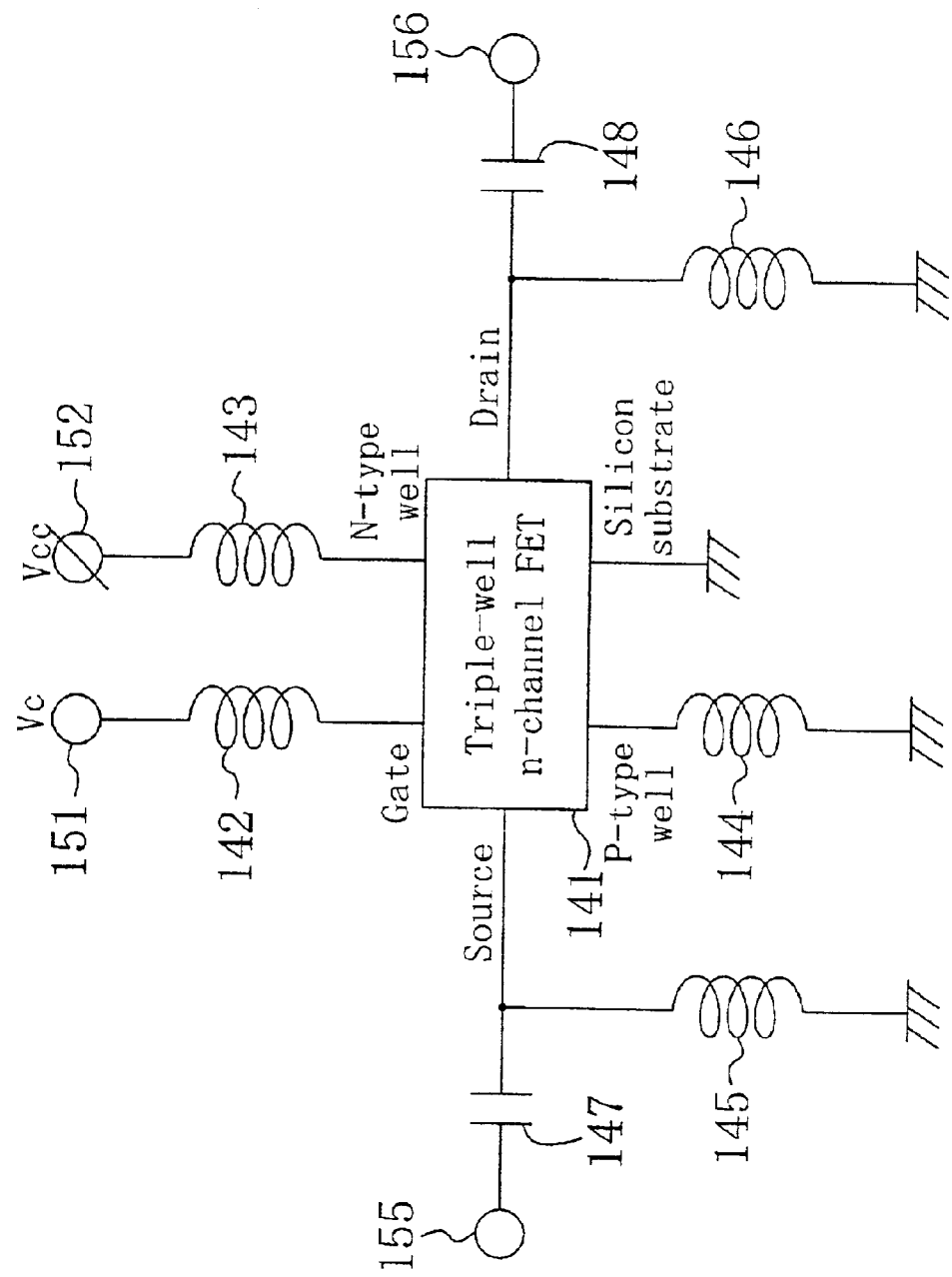
FIG. 4 is an electric circuit diagram illustrating a circuit configuration of a high frequency switch circuit device according to a second embodiment of the present invention.
Figure 5A:
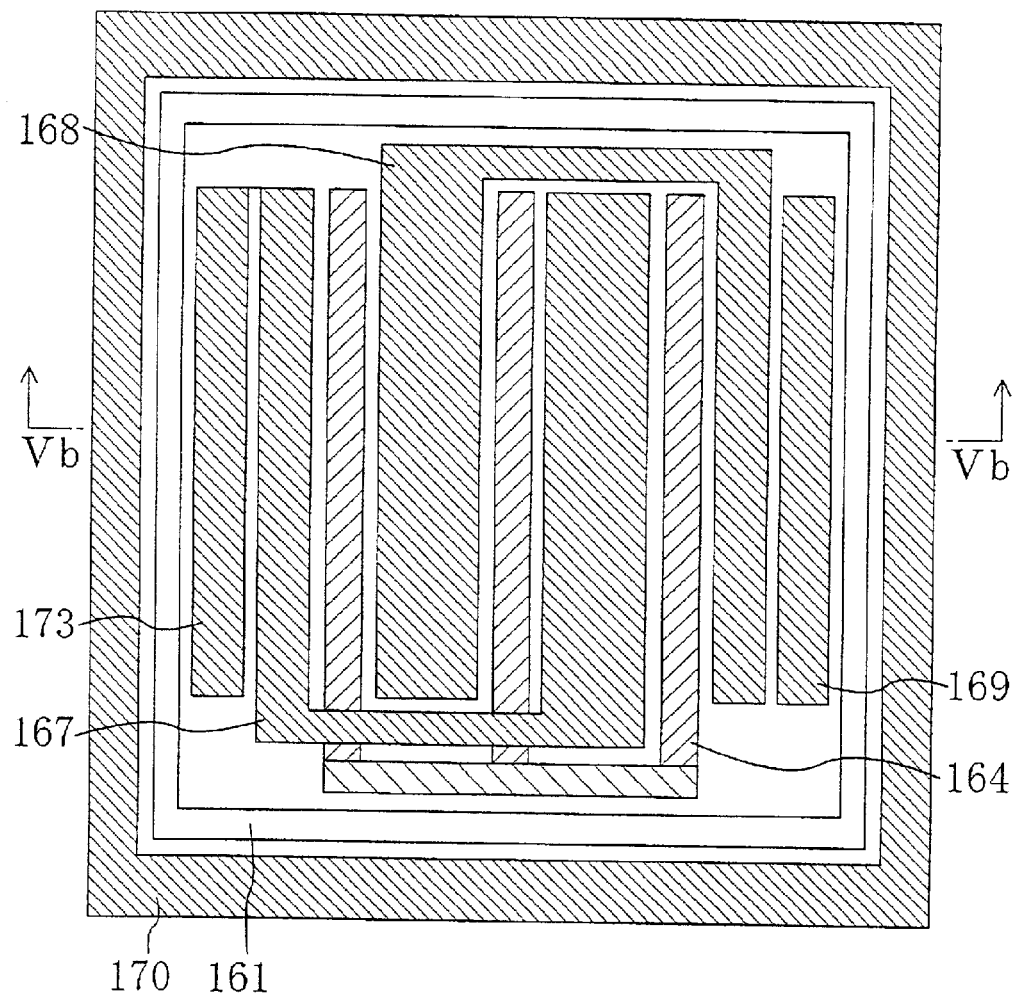
FIG. 5A is a plan view illustrating a triple-well n-channel FET of the second embodiment.
Figure 5B:
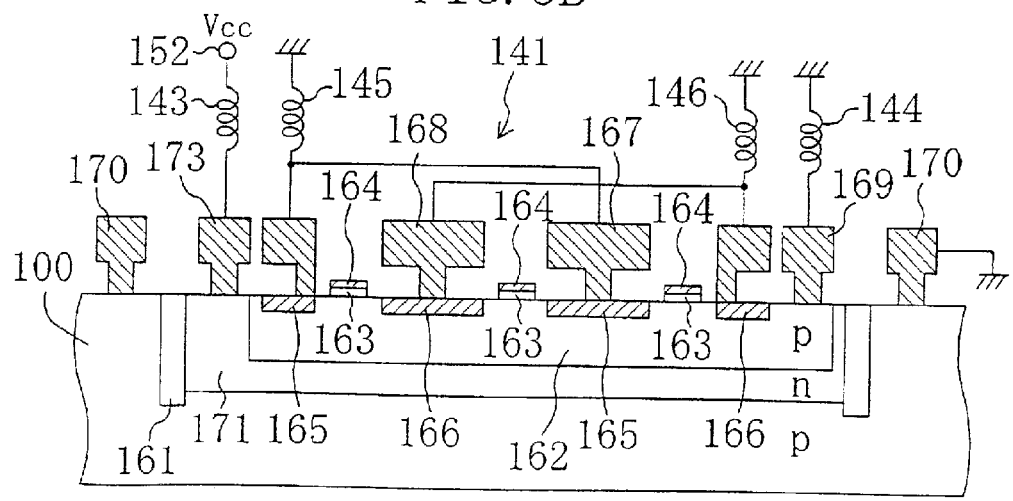
FIG. 5B is a cross-sectional view taken along line Vb—Vb.

FIG. 4 is an electric circuit diagram illustrating a circuit configuration of a high frequency switch circuit device according to a second embodiment of the present invention. As illustrated in the figure, the high frequency switch circuit device of the present embodiment includes a triple-well n-channel FET 141 that is a switching element having a cross-sectional structure as illustrated in FIG. 5B to be described later. The triple-well n-channel FET 141 includes a source, a drain, a gate, a p-type well corresponding to a back gate, and an n-type well, which are provided on a silicon substrate. The gate of the triple-well n-channel FET 141 is connected, via an inductor 142, to a control voltage supply node 151 for supplying the control voltage Vc, the p-type well corresponding to the back gate is connected to the ground via an inductor 144, and the n-type well is connected, via an inductor 143, to a fixing voltage supply node 152 for supplying a fixing voltage Vcc. The source of the triple-well n-channel FET 141 is connected to the ground via an inductor 145 and to a first node 155 via a capacitor 147. The drain of the triple-well n-channel FET 141 is connected to the ground via an inductor 146 and to a second node 156 via a capacitor 148. The silicon substrate is connected to the ground.

The inductors 142 to 146 are designed so that the impedance of the frequency of a signal passing therethrough is sufficiently larger than those of the first node 155 and the second node 156. The capacitors 147 and 148 are provided for blocking a DC component from passing from the first and second nodes 155 and 156, respectively, to the triple-well n-channel FET 141.

With such a configuration, the p-type well corresponding to the back gate of the triple-well n-channel FET 141 and the p-type substrate region connected to the ground of the p-type silicon substrate are separated by the inductor 144 from each other with respect to high frequencies. In other words, the configuration is such that the flow of a high frequency component of a signal is blocked.

The triple-well n-channel FET 141 illustrated in FIG. 4 corresponds to the first to fourth transistors 201 to 204 in the high frequency switch circuit illustrated in FIG. 8, and the first and second nodes 155 and 156 each correspond to a node between transistors. It can be assumed that capacitors are provided as necessary also in the conventional circuit illustrated in FIG. 8.

The operation of the high frequency switch circuit device having the configuration described above will now be described. When the control voltage Vc supplied from the control voltage supply node 151 is set to a high level, the triple-well n-channel FET 141 is closed (turned ON), whereby an electric signal flows between the first node 155 and the second node 156. When the control voltage Vc is set to a low level, the triple-well n-channel FET 141 is opened (turned OFF), thereby blocking the flow of an electric signal flowing between the first node 155 and the second node 156.

Therefore, it is possible to obtain a high frequency switch circuit that is suitable for an antenna circuit of a mobile communication device by, for example, configuring a high frequency switch circuit as illustrated in FIG. 8 while incorporating a high frequency switch circuit device that includes the triple-well n-channel FET 141 therein as in the present embodiment. Alternatively, the high frequency switch circuit device of the present embodiment can be used in various other types of devices for selectively blocking or transmitting the flow of a high frequency signal.

Next, an example of a configuration of the triple-well n-channel FET 141 illustrated in FIG. 4 will be described with reference to FIG. 5A and FIG. 5B. FIG. 5A is a plan view illustrating a triple-well n-channel FET of the present embodiment, and FIG. 5B is a cross-sectional view taken along line Vb—Vb of FIG. 5A.

As illustrated in FIG. 5A and FIG. 5B, an n-type well layer 171, a p-type well layer 162 and a trench isolation insulative layer 161 are formed in an upper portion of a p-type silicon substrate 140, which is a p-type silicon semiconductor. The trench isolation insulative layer 161 surrounds the n-type well layer 171 so as to isolate and insulate the n-type well layer 171 from a p-type substrate region of the p-type silicon substrate 140. Various elements of the triple-well n-channel FET 141 are provided as follows. A gate oxide film 163 made of a silicon oxide is provided on the p-type well layer 162, and a gate electrode 164 made of a polysilicon is provided on the gate oxide film 163. A source layer 165 and a drain layer 166 containing an n-type impurity are formed in the p-type well layer 162 beside the gate electrode 164. Moreover, there are formed a source line 167 connected to the source layer 165, a drain line 168 connected to the drain layer 166, a p-type well line 169 connected to the p-type well layer 162, an n-type well line 173 connected to the n-type well layer 171, and a p-type silicon substrate line 170 connected to the p-type silicon substrate 140.

As illustrated in FIG. 5B, the p-type well line 169 is connected to the ground via the inductor 144, the source line 167 is connected to the ground via the inductor 145, and the drain line 168 is connected to the ground via the inductor 146. Although not shown in FIG. 5B, the gate electrode 164 is connected to the control voltage supply node 151 via the inductor 142 illustrated in FIG. 4, the source line 167 is connected to the first node 155 via the capacitor 147 illustrated in FIG. 4, and the drain line 168 is connected to the second node 156 via the capacitor 148 illustrated in FIG. 4. Each of the first and second nodes 155 and 156 is, for example, a line provided between the triple-well n-channel FET 141 and an adjacent FET, or an external signal connection terminal (output terminal or input terminal) for providing a connection to an external device.

Although not shown in FIG. 5B, the inductors and the capacitors as described above may be formed on the p-type silicon substrate 140, or the inductors and the capacitors may alternatively be provided as discrete chip inductors and discrete chip condensers, respectively.

In the high frequency switch circuit device illustrated in FIG. 5A and FIG. 5B, when a positive control voltage Vc is applied to the fixing voltage supply node 152, a reverse bias is applied between the p-type substrate region and the n-type well layer 171 of the p-type silicon substrate 140, thereby expanding the depletion layer at the p-n junction therebetween, so that the p-type substrate region and the n-type well layer 171 of the p-type silicon substrate 140 are separated from each other in the vertical direction. At this time, a reverse bias is also applied between the p-type well layer 162 and the n-type well layer 171, thereby expanding the depletion layer at the p-n junction therebetween, so that the p-type well layer 162 and the n-type well layer 171 are separated from each other.

Next, the functions and effects provided by the high frequency switch circuit device of the present embodiment will be described with reference to FIG. 4, FIG. 5A and FIG. 5B.

The high frequency switch circuit device of the second embodiment of the present invention includes the inductor 144 between the p-type well (p-type well layer 162) corresponding to the back gate of the triple-well n-channel FET 141 and the ground, as illustrated in FIG. 4, whereby a high frequency component of a signal passing between the p-type well of the triple-well n-channel FET 141 and the ground is blocked in the circuit. Moreover, the n-type well layer 171 is provided between the p-type substrate region and the p-type well layer 162 of the p-type silicon substrate 140 so that the n-type well layer 171 functions as a barrier layer for blocking a high frequency signal between the p-type substrate region and the p-type well layer 162 of the p-type silicon substrate 140. Thus, a p-n junction (depletion layer), at which a reverse bias is applied by the fixing voltage, is formed between the p-type substrate region and the n-type well layer 171 and between the p-type well layer 162 to be the back gate and the n-type well layer 171. Due to the double depletion layer structure, the flow of a high frequency signal between the p-type substrate region and the p-type well layer 162 is blocked in the p-type silicon substrate 140. Therefore, even when the high frequency switch circuit is integrated together with other semiconductor circuits into the p-type silicon substrate 140, the signal leak via the back gate can be reduced, thereby reducing the transmission loss of a high frequency signal.

Moreover, the n-type well layer 171 and the p-type substrate region of the p-type silicon substrate 140 are separated by the trench isolation insulative layer 161 in the horizontal direction. Thus, the flow of a high frequency signal in the horizontal direction through the p-type silicon substrate 140 is blocked. Therefore, it is possible to more reliably reduce the transmission loss of a high frequency signal, which is particularly significant near the surface.

In the second embodiment, it is preferred that the inductors 142 to 145 are provided, in addition to the triple-well n-channel FET 141, in the single p-type silicon substrate 140. Each of the inductors 142 to 145 may be a coil-shaped line, for example. It is possible to reduce the size and the cost of a high frequency switch circuit device by integrating the inductors 142 to 145 into a silicon semiconductor.

An example where an inductor is provided as means for blocking the flow of a high frequency signal between a p-type well corresponding to a back gate and a fixing voltage supply node (high frequency signal separation means) has been described above. Alternatively, effects as those of the second embodiment can be obtained by using another type of element such as a resistor made of a polysilicon, or a line having a line length that is an odd number multiple of ¼ of the wavelength of a signal passing therethrough, as means for separating a high frequency component of a signal that is handled by the FET.

Third Embodiment

Figure 6:
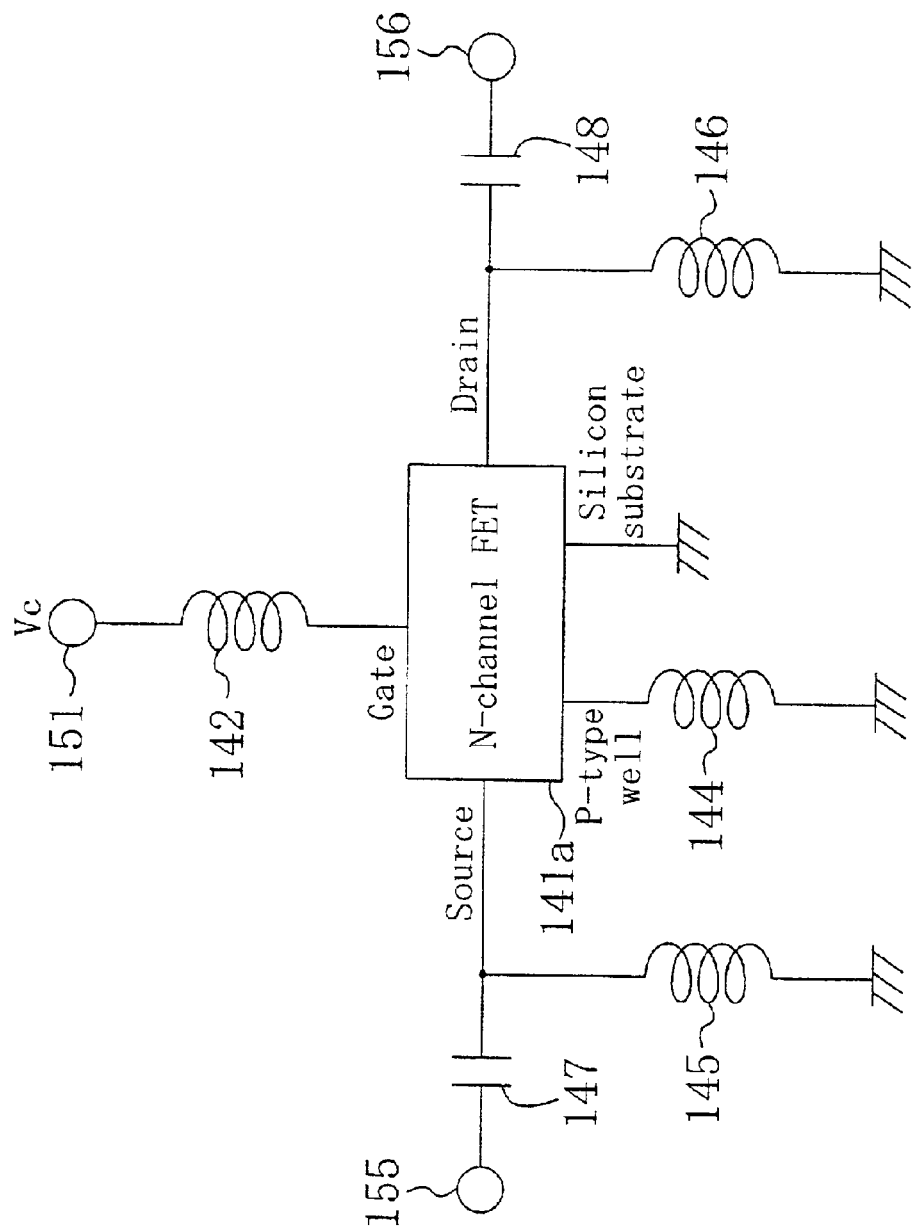
FIG. 6 is an electric circuit diagram illustrating a circuit configuration of a high frequency switch circuit device according to a third embodiment of the present invention.
Figure 7A:
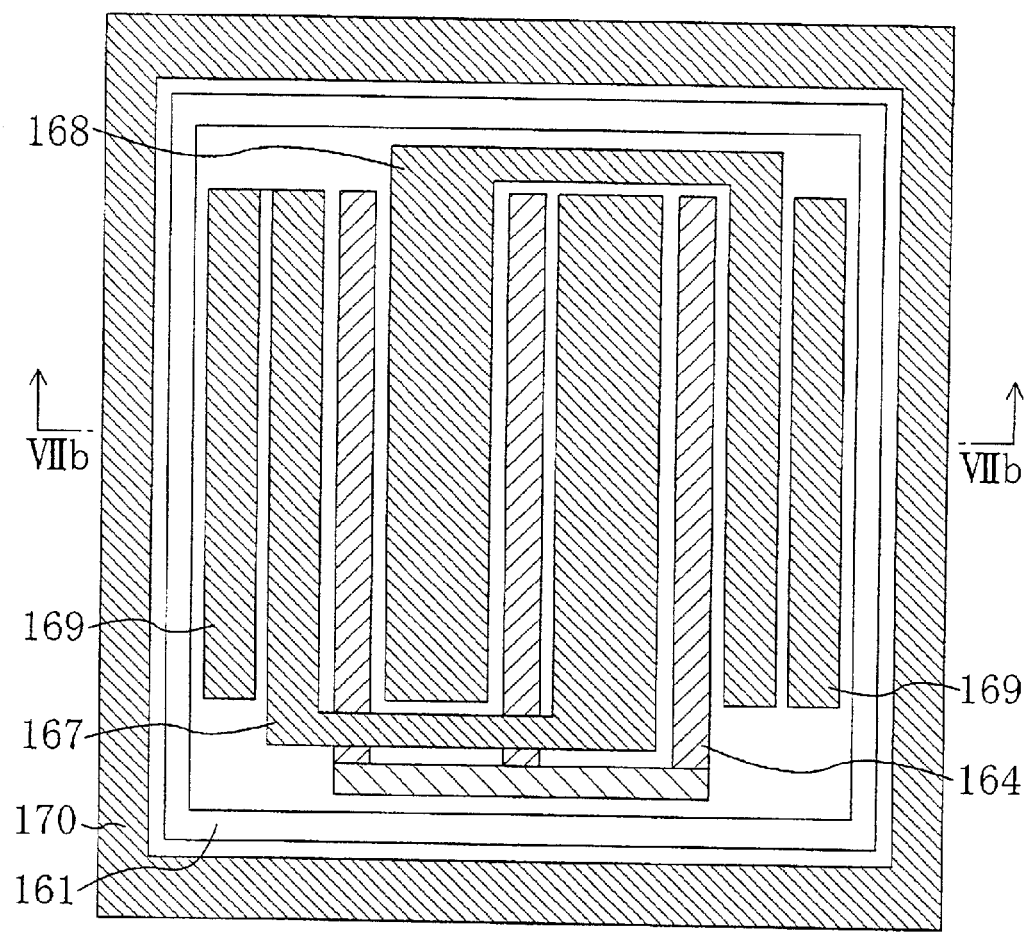
FIG. 7A is a plan view illustrating an n-channel FET of the third embodiment.
Figure 7B:
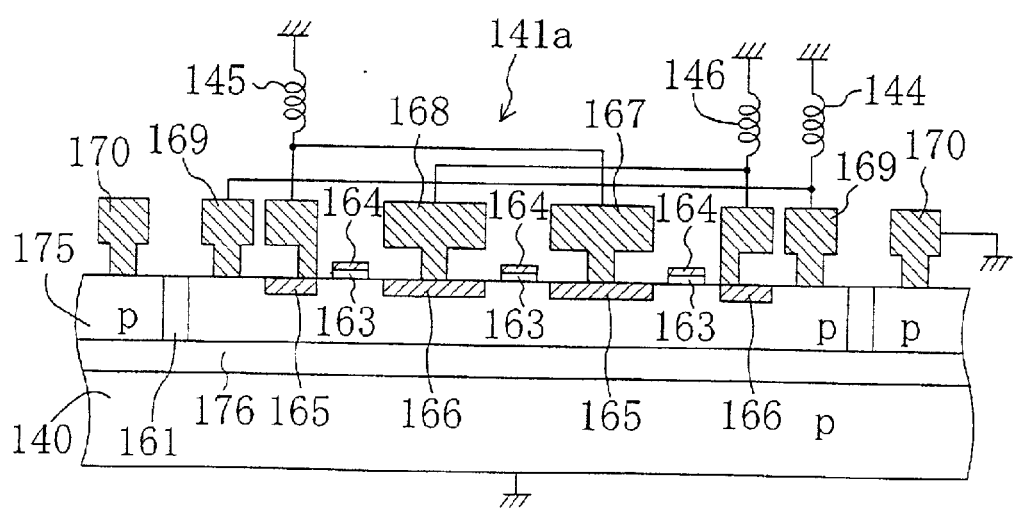
FIG. 7B is a cross-sectional view taken along line VIIb—VIIb.

FIG. 6 is an electric circuit diagram illustrating a circuit configuration of a high frequency switch circuit device according to a third embodiment of the present invention. As illustrated in the figure, the high frequency switch circuit device of the present embodiment includes an n-channel FET 141a that is a switching element having a cross-sectional structure as illustrated in FIG. 7B to be described later. The n-channel FET 141a includes a source, a drain, a gate, and a p-type well corresponding to a back gate, which are provided on a silicon substrate. The gate of the n-channel FET 141a is connected, via an inductor 142, to a control voltage supply node 151 for supplying the control voltage Vc, and the p-type well corresponding to the back gate is connected to the ground via an inductor 144. The source of the n-channel FET 141a is connected to the ground via an inductor 145 and to a first node 155 via a capacitor 147. The drain of the n-channel FET 141a is connected to the ground via an inductor 146 and to a second node 156 via a capacitor 148. The silicon substrate is connected to the ground.

The inductors 142 and 144 to 146 are designed so that the impedance of the frequency of a signal passing therethrough is sufficiently larger than those of the first node 155 and the second node 156. The capacitors 147 and 148 are provided for blocking a DC component from passing from the first and second nodes 155 and 156, respectively, to the n-channel FET 141a. In the present embodiment, a region of the p-type silicon substrate 140 below a buried insulative film 176 and the p-type silicon layer 175 are p-type substrate regions.

With such a configuration, the p-type well corresponding to the back gate of the n-channel FET 141a and the p-type silicon layer 175 connected to the ground are separated by the inductor 144 from each other with respect to high frequencies. In other words, the configuration is such that the flow of a high frequency component of a signal is blocked.

The n-channel FET 141a illustrated in FIG. 6 corresponds to the first to fourth transistors 201 to 204 in the high frequency switch circuit illustrated in FIG. 8, and the first and second nodes 155 and 156 each correspond to a node between transistors. It can be assumed that capacitors are provided as necessary also in the conventional circuit illustrated in FIG. 8.

The operation of the high frequency switch circuit device having the configuration described above will now be described. When the control voltage Vc supplied from the control voltage supply node 151 is set to a high level, the n-channel FET 141a is closed (turned ON), whereby an electric signal flows between the first node 155 and the second node 156. When the control voltage Vc is set to a low level, the n-channel FET 141a is opened (turned OFF), thereby blocking the flow of an electric signal flowing between the first node 155 and the second node 156.

Therefore, it is possible to obtain a high frequency switch circuit that is suitable for an antenna circuit of a mobile communication device by, for example, configuring a high frequency switch circuit as illustrated in FIG. 8 while incorporating a high frequency switch circuit device that includes the n-channel FET 141a therein as in the present embodiment. Alternatively, the high frequency switch circuit device of the present embodiment can be used in various other types of devices for selectively blocking or transmitting the flow of a high frequency signal.

Next, an example of a configuration of the n-channel FET 141a illustrated in FIG. 6 will be described with reference to FIG. 7A and FIG. 7B. FIG. 7A is a plan view illustrating an n-channel FET of the present embodiment, and FIG. 7B is a cross-sectional view taken along line VIIb—VIIb of FIG. 7A.

As illustrated in FIG. 7A and FIG. 7B, in this variation, the buried insulative film 176, which is made of a silicon oxide, is formed at a predetermined depth from the surface of the p-type silicon substrate 140. The p-type well layer 162, the p-type silicon layer 175, and a trench isolation insulative layer 161 surrounding the p-type well layer 162 so as to separate and insulate the p-type well layer 162 and the p-type silicon layer 175 from each other in the horizontal direction, are formed above the buried insulative film 176.

Various elements of the n-channel FET 141a are provided as follows. A gate oxide film 163 made of a silicon oxide is provided on the p-type well layer 162, and a gate electrode 164 made of a polysilicon is provided on the gate oxide film 163. A source layer 165 and a drain layer 166 containing an n-type impurity are formed in the p-type well layer 162 beside the gate electrode 164. Moreover, there are formed a source line 167 connected to the source layer 165, a drain line 168 connected to the drain layer 166, a p-type well line 169 connected to the p-type well layer 162, and a p-type silicon substrate line 170 connected to the p-type silicon layer 175.

As illustrated in FIG. 7B, the p-type well line 169 is connected to the ground via the inductor 144, the source line 167 is connected to the ground via the inductor 145, the drain line 168 is connected to the ground via the inductor 146, and the p-type silicon layer 175 is connected to the ground. Although not shown in FIG. 7B, the gate electrode 164 is connected to the control voltage supply node 151 via the inductor 142 illustrated in FIG. 6, the source line 167 is connected to the first node 155 via the capacitor 147 illustrated in FIG. 6, and the drain line 168 is connected to the second node 156 via the capacitor 148 illustrated in FIG. 6. Each of the first and second nodes 155 and 156 is, for example, a line provided between the n-channel FET 141a and an adjacent FET, or an external signal connection terminal (output terminal or input terminal) for providing a connection to an external device.

Although not shown in FIG. 7B, the inductors and the capacitors as described above may be formed on the p-type silicon substrate 140, or the inductors and the capacitors may alternatively be provided as discrete chip inductors and discrete chip condensers, respectively.

Next, the functions and effects provided by the high frequency switch circuit device of the present embodiment will be described with reference to FIG. 6, FIG. 7A and FIG. 7B.

The high frequency switch circuit device of the third embodiment of the present invention includes the inductor 144 between the p-type well (p-type well layer 162) corresponding to the back gate of the n-channel FET 141a and the ground, as illustrated in FIG. 6, whereby a high frequency component of a signal passing between the p-type well of the n-channel FET 141a and the ground is blocked in the circuit. Moreover, the buried insulative film 176 is provided in the p-type silicon substrate 140 so that the buried insulative film 176 functions as a barrier layer for blocking a high frequency signal between the p-type substrate region and the p-type well layer 162 of the p-type silicon substrate 140. Thus, the flow of a high frequency signal between the p-type silicon substrate 140 and the p-type well (back gate) is blocked by the buried insulative film 176 in the p-type silicon substrate 140. Therefore, even when the high frequency switch circuit is integrated together with other semiconductor circuits into the p-type silicon substrate 140, the signal leak via the back gate can be reduced, thereby reducing the transmission loss of a high frequency signal.

In the third embodiment, it is preferred that the inductors 142 to 145 are provided, in addition to the n-channel FET 141a, in the single p-type silicon substrate 140. Each of the inductors 142 to 145 may be a coil-shaped line, for example. It is possible to reduce the size and the cost of a high frequency switch circuit device by integrating the inductors 142 to 145 into a silicon semiconductor.

An example where an inductor is provided as means for blocking the flow of a high frequency signal between a p-type well corresponding to a back gate and a fixing voltage supply node (high frequency signal separation means) has been described above. Alternatively, effects as those of the third embodiment can be obtained by using another type of element such as a resistor made of a polysilicon, or a line having a line length that is an odd number multiple of ¼ of the wavelength of a signal passing therethrough, as means for separating a high frequency component of a signal that is handled by the FET.

Moreover, in third embodiment, a substrate in which the p-type silicon substrate 140 and the n-type well layer 162 corresponding to the back gate are separated from each other by the buried insulative film 176 is used as an SOI substrate. Alternatively, an SOI substrate obtained by providing a semiconductor layer on an insulative substrate may of course be used. For example, such an SOI substrate may be obtained by epitaxially growing a single-crystal silicon layer on a sapphire substrate or a spinel substrate.

Figure 9:
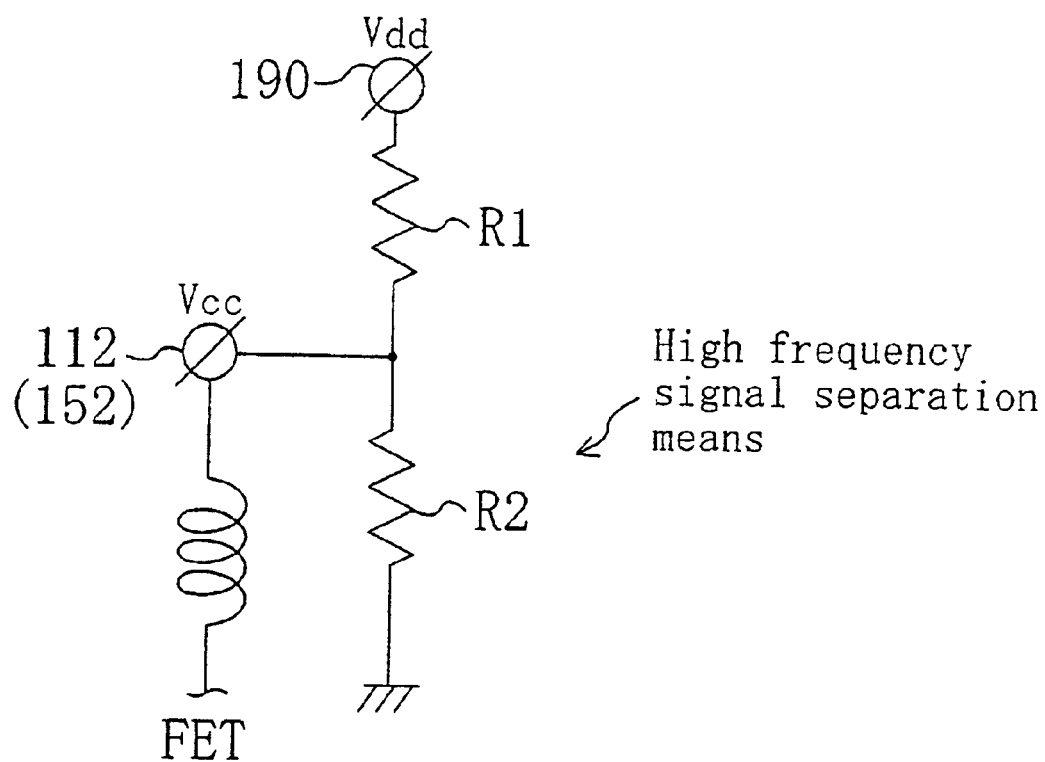
FIG. 9 is a diagram illustrating an example where a resistor is provided between a fixing voltage supply node and the ground in the first and second embodiments.

It is actually often the case that the fixing voltage supply node 112 (152) of the first or second embodiment is connected, via a resistor R1, to a power supply voltage supply node 190 for supplying a power supply voltage Vdd, as illustrated in FIG. 9. In such a case, it is possible to further stabilize the voltage of the back gate and suppress the transmission loss of a high frequency signal by further providing a resistor R2 between the fixing voltage supply node 112 (152) and the ground.

In each of the embodiments described above, the semiconductor substrate is a semiconductor substrate that only includes a silicon layer. However, the present invention is not limited to such embodiments, but may employ a semiconductor substrate including an SiGe layer and/or an SiGeC layer.

What is claimed is:

1. A high frequency switch circuit device, comprising:
   a semiconductor substrate including a p-type substrate region;
   a p-channel type FET provided in the p-type substrate region and functioning as a high frequency switching element including a source, a drain, a gate and an n-type well;
   a voltage supply node connected to the n-type well for supplying a voltage to the n-type well;
   high frequency signal separation means provided between the n-type well and the voltage supply node for separating a high frequency component of a signal flowing between the n-type well and the voltage supply node;
   a source electrode connected to the source, wherein said source electrode is separated from an electrode of the n-type well; and
   an input signal node connected to the source.

2. The high frequency switch circuit device of claim 1, further comprising an insulative separation layer surrounding the n-type well and extending downward from a surface of the semiconductor substrate to a position deeper than the n-type well.

3. The high frequency switch circuit device of claim 1, wherein the semiconductor substrate is an SOI substrate obtained by providing the n-type well on an insulator layer.

4. The high frequency switch circuit device of claim 3, wherein the SOI substrate is a silicon substrate having a buried insulative layer made of silicon oxide.

5. The high frequency switch circuit device of claim 3, wherein the SOI substrate is obtained by epitaxially growing a silicon crystal layer on a sapphire substrate.

6. The high frequency switch circuit device of claim 1, further comprising another high frequency signal separation means provided between the n-type well and a ground so as to separate a high frequency component of a signal flowing between the n-type well and the ground.

7. The high frequency switch circuit device of claim 1, wherein the high frequency signal separation means is an inductor.

8. The high frequency switch circuit device of claim 7, wherein the inductor is a coil-shaped line formed on the semiconductor substrate.

9. The high frequency switch circuit device of claim 1, wherein the high frequency signal separation means is a resistor.

10. The high frequency switch circuit device of claim 9, wherein the resistor is a polysilicon film formed on the semiconductor substrate.

11. The high frequency switch circuit device of claim 1, wherein the high frequency signal separation means is a line having a line length that is an odd number multiple of ¼ of a wavelength of a signal passing therethrough.

12. The high frequency switch circuit device of claim 11, wherein the line is formed on the semiconductor substrate.

13. The high frequency switch circuit device of claim 1, further comprising a drain electrode connected to the drain, wherein said drain electrode is separated from an electrode of the n-type well.

14. A high frequency switch circuit device, comprising:
   a semiconductor substrate including a p-type substrate region;
   an n-channel type FET provided in the p-type substrate region and functioning as a high frequency switching element including a source, a drain, a gate and a p-type well;
   a barrier layer provided between the p-type substrate region and the p-type well and serving as a barrier against a flow of a high frequency signal between the p-type substrate region and the p-type well;
   high frequency signal separation means provided between the p-type well and a ground for separating a high frequency component of a signal flowing between the p-type well and the ground;
   a source electrode connected to the source, wherein said source electrode is separated from an electrode of the p-type well; and
   an input signal node connected to the source.

15. The high frequency switch circuit device of claim 14, wherein:
   the barrier layer is an n-type well provided between the p-type substrate region and the p-type well, the high frequency switch circuit device further comprising:
   a voltage supply node connected to the n-type well for supplying a voltage to the n-type well; and
   another high frequency signal separation means provided between the n-type well and the voltage supply node so as to separate a high frequency component of a signal flowing between the n-type well and the voltage supply node.

16. The high frequency switch circuit device of claim 14, further comprising an insulative separation layer surrounding the p-type well and extending downward from a surface of the semiconductor substrate to a position deeper than the p-type well.

17. The high frequency switch circuit device of claim 14, wherein the semiconductor substrate is an SOI substrate obtained by providing the p-type well on an insulator layer.

18. The high frequency switch circuit device of claim 17, wherein the SOI substrate is a silicon substrate having a buried insulative layer made of silicon oxide.

19. The high frequency switch circuit device of claim 17, wherein the SOI substrate is obtained by epitaxially growing a silicon crystal layer on a sapphire substrate.

20. The high frequency switch circuit device of claim 14, further comprising another high frequency signal separation means provided between the p-type well and a ground so as to separate a high frequency component of a signal flowing between the p-type well and the ground.

21. The high frequency switch circuit device of claim 14, wherein the high frequency signal separation means is an inductor.

22. The high frequency switch circuit device of claim 21, wherein the inductor is a coil-shaped line formed on the semiconductor substrate.

23. The high frequency switch circuit device of claim 14, wherein the high frequency signal separation means is a resistor.

24. The high frequency switch circuit device of claim 23, wherein the resistor is a polysilicon film formed on the semiconductor substrate.

25. The high frequency switch circuit device of claim 14, wherein the high frequency signal separation means is a line having a line length that is an odd number multiple of ¼ of a wavelength of a signal passing therethrough.

26. The high frequency switch circuit device of claim 25, wherein the line is formed on the semiconductor substrate.

27. The high frequency switch circuit device of claim 14, further comprising a drain electrode connected to the drain, wherein said drain electrode is separated from an electrode of the p-type well.

* * * * *